United States Patent
Wilk et al.

[19]

[11] Patent Number: 6,020,247
[45] Date of Patent: Feb. 1, 2000

[54] METHOD FOR THIN FILM DEPOSITION ON SINGLE-CRYSTAL SEMICONDUCTOR SUBSTRATES

[75] Inventors: Glen D. Wilk, Dallas, Tex.; Yi Wei, Chandler, Ariz.; Robert M. Wallace, Richardson, Tex.

[73] Assignee: Texas Instruments Incorporated, Dallas, Tex.

[21] Appl. No.: 08/904,009

[22] Filed: Jul. 31, 1997

[51] Int. Cl.[7] .......................... H01L 21/20; H01L 21/31; H01L 21/469

[52] U.S. Cl. ............................. 438/398; 438/758

[58] Field of Search ..................... 438/758, 398

[56] References Cited

U.S. PATENT DOCUMENTS

| | | |
|---|---|---|
| 4,647,361 | 3/1987 | Bauer . |
| 5,244,843 | 9/1993 | Chau et al. . |
| 5,360,769 | 11/1994 | Thakur et al. .......................... 437/239 |

FOREIGN PATENT DOCUMENTS

| | | | |
|---|---|---|---|
| 0 637 063 A1 | 2/1995 | European Pat. Off. ................. | 21/306 |
| 0 637 063 A1 | 5/1995 | European Pat. Off. . | |
| 63-50915 | 6/1988 | Japan ....................................... | 21/205 |
| 63-262839 | 10/1988 | Japan ....................................... | 21/28 |

OTHER PUBLICATIONS

J. Lundsgaard Hansen, et al., Improvement of the Morphological Quality of the Si Surface Using an Optimised In–Situ Oxide Removal Procedure Prior to MBE Growth, Journal of Crystal Growth, vol. 57, No. 1–4, Dec. 1995, pp. 317–322.
R.W. Hardeman, et al., Oxide Removal from Silicon Wafers Studied by Transient Mass Spectrometry and X–Ray Photoelectron Spectroscopy, Proceeding of the 1$^{st}$ Int. Symp. On Silicon Molecular Beam Epitaxy 14–17, May 1985, pp. 16–26.
Yasuo Kunii, et al., Si Surface Cleaning by Si2H6–H2 Gas Etching and its Effects on Solid–Phase Epitaxy, Japanese Journal of Applied Physics, vol. 26, No. 11, Nov. 1987, pp. 1816–1822.
K. Saitio, et al., Effect of Silicon Surface Cleaning on the Initial Stage of Selective Titanium Silicide Chemical Vapor Deposition, Japanese Journal of Applied Physics, Supplements, Aug. 28, 1989, pp. 541–542.
Si–Beam Radiation Cleaning in Molecular–Beam Epitaxy, Koichi Kugimiya, et al., Japanese Journal of Applied Physics, vol. 24, No. 5, May, 1985, pp. 564–567.
Etching of SiO$_2$ , Films by Si in Ultra–High Vacuum, Michiharu Tabe, Japanese Journal of Applied Physics, vol. 21, No. 3, Mar. 1982, pp. 534–538.
Self Cleaning of the Si Surface in Molecular Beam Epitaxy, K. Kugimiya, et al., Abstract.

Primary Examiner—John F. Niebling
Assistant Examiner—Josetta Jones
Attorney, Agent, or Firm—David Denker; Robby T. Holland; Richard L. Donaldson

[57] ABSTRACT

A method of preparing a surface for and forming a thin film on a single-crystal silicon substrate is disclosed. One embodiment of his method comprises forming an oxidized silicon layer (which may be a native oxide) on at least one region of the substrate, and thermally annealing the substrate in a vacuum while supplying a silicon-containing flux to the oxide surface, thus removing the oxidized silicon layer. Preferably, the thin film is formed immediately after removal of the oxidized silicon layer. The silicon-containing flux is preferably insufficient to deposit a silicon-containing layer on top of the oxidized silicon layer, and yet sufficient to substantially inhibit an SiO-forming reaction between the silicon substrate and the oxidized silicon layer. The method of the invention allows for growth or deposition of films which have exceptionally smooth interfaces (less than 0.1 nm rms roughness) with the underlying silicon substrate at temperatures less than 800° C., and is ideally suited for deposition of ultrathin films having thicknesses less than about 5 nm.

16 Claims, 3 Drawing Sheets

METHOD FOR THIN FILM DEPOSITION ON SINGLE-CRYSTAL SEMICONDUCTOR SUBSTRATES

LICENSE RIGHTS

The U.S. Government may have special rights regarding this invention as provided for in the terms of Contract #F49620-96-C-0006 administered by the Advanced Research Projects Administration (ARPA).

FIELD OF THE INVENTION

This invention pertains generally to semiconductor fabrication methods and more specifically to the surface preparation, surface cleaning, and deposition of thin films on silicon.

BACKGROUND OF THE INVENTION

Microelectronic circuits are typically fabricated on single-crystal silicon substrates. Fabrication of such circuits requires that several different materials, deposited or grown as thin films, contact the silicon substrate in precise patterns. For example, a field effect transistor formed on a silicon substrate requires an insulating gate dielectric thin film overlying the channel region of the transistor, and may also require a film forming several conductive contacts to the substrate on opposite sides of this channel region.

The microelectronics industry continually strives to increase performance, decrease power consumption, and decrease per-unit costs of microelectronic circuits. To realize these goals, each new generation of circuits typically integrates smaller devices onto the silicon substrate than its predecessors did, including in many cases thinner films contacting the silicon substrate. Miniaturization of devices is now approaching the level where the quality of the interface between the substrate and a deposited film, on an atomic scale, becomes significant.

SUMMARY OF THE INVENTION

It has now been found that one of the critical issues for continued miniaturization of microelectronic circuits is the uniformity of the ultrathin films used as gate dielectrics. For example, where $SiO_2$ is used as a gate dielectric with a thickness less than about 3 nm, the roughness of the atomic interface between a silicon substrate and the overlying $SiO_2$ layer may greatly affect device reliability and performance. Even a small amount of nonuniformity at this interface, on the order of 0.1 nm, may significantly reduce gate dielectric breakdown field and carrier mobility in the devices.

It has also now been found that present low-temperature methods for thin film formation typically produce nonuniform atomic-level interfaces at low temperature. For example, the acid etching step normally performed just prior to film deposition leaves an unstepped silicon surface with an rms roughness of about 0.4 nm. Other surface preparation methods, such as thermal desorption of a native oxide at low temperature (e.g. 800° C.), produce pinholes several nanometers deep and ranging in size up to about half a micron wide. In contrast, the present invention may be used at temperatures less than 800° C. to form a prepared surface with no pinholes, a measured rms roughness as low as 0.05 nm, and a surface structure similar to that formed with a high temperature (1200° C.) anneal step.

The present invention comprises a low temperature process for preparing a silicon surface for subsequent growth of a thin film which has an atomically flat and uniform interface with the underlying silicon substrate. This process may comprise the step of forming an oxidized silicon layer on a region of a single-crystal silicon substrate, or providing such a substrate with a pre-existing oxidized silicon layer. This process further comprises placing the substrate in a vacuum, and then providing a silicon-containing flux to the substrate at a flux which is insufficient to deposit a silicon-containing layer on top of the oxidized silicon layer, but is sufficient to substantially inhibit an SiO-forming reaction between the silicon substrate and the oxidized silicon layer. This flux is continued until the oxidized silicon layer is removed from the substrate region. A thin film of a desired composition may then be deposited or grown on the resulting atomically flat, single atomic-height stepped silicon surface, preferably without breaking the vacuum.

In the simplest embodiment, the oxidized silicon layer is a native oxide layer, but the oxidized silicon layer may also be purposely grown. The silicon-containing flux is preferably supplied in a temperature range of about 640° C. to 1050° C., and is preferably started at or before the substrate reaches a temperature of about 780° C. In one embodiment, the silicon-containing flux is supplied to the substrate by a physical vapor deposition technique, e.g. sputtering or evaporation. In an alternate embodiment, the silicon-containing flux is supplied to the substrate by a chemical vapor deposition method.

The present invention finds application in the deposition of: gate dielectrics, e.g. silicon dioxide, silicon nitride, tantalum pentoxide, titanium dioxide, barium titanate, strontium titanate, bismuth titanate, and combinations thereof; other insulating films; conducting films, e.g. metal, metal silicides, and polysilicon; semiconducting films; and tunnel barriers associated with Si-based resonant tunneling devices. The present invention has particular application to the deposition of films on substrates having microelectronic devices partially formed thereon, since the method produces an extremely smooth interface between the film and the substrate without requiring a high temperature anneal step.

BRIEF DESCRIPTION OF THE DRAWING

The present invention, including various features and advantages thereof, may be best understood by reference to the following drawing, wherein.

DETAILED DESCRIPTION OF THE PREFERRED EMBODIMENTS

Several terms have been given the following definitions as used herein. The term "native oxide" is defined herein to mean films which are not grown under controlled conditions, are composed substantially of silicon oxide (films having a composition which is substantially $SiO_x$, wherein x has a value between 1 and 2, inclusive) and have a thickness less than about 5 nm. The term "silicon flux" is defined herein to mean a controlled number of silicon atoms impinging upon a substrate surface per second per unit area. The flux may comprise individual silicon atoms, or be contained in molecules of a reactive species such as silane, disilane, or silicon tetrachloride. An "equivalent rate" is a silicon flux expressed as the epitaxial growth rate that would be observed if the flux were directed at a clean single-crystal substrate under epitaxial growth conditions. A reaction is "substantially inhibited" if its rate is reduced by at least half by the inhibiting factor. And a "vacuum" is defined herein to mean a space in which the pressure is less than one-tenth of atmospheric pressure.

Figure 1:
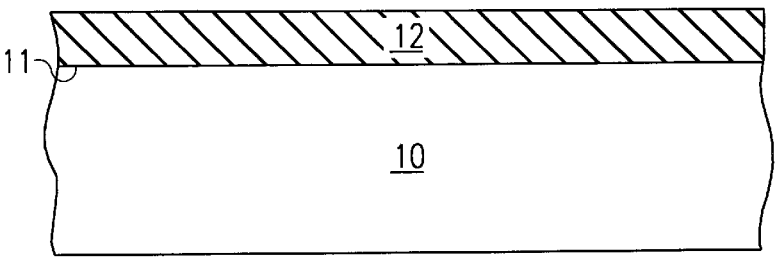
FIG. 1 illustrates a cross-section of a substrate having an oxidized silicon layer deposited or grown thereon.

Single-crystal silicon is highly reactive, and is consequently almost always coated with some type of film. Bare silicon surfaces readily react with oxygen in the atmosphere to form a thin (typically less than 5 nm thick), low-quality native oxide layer, which may contain trace amounts of other species such as carbon. In some cases, this layer is avoided by purposely forming a thin protective oxide or nitride layer on a bare substrate. FIG. 1 illustrates a silicon substrate 10 having an oxidized silicon layer 12 (which may be either a native or a protective oxide) formed with a silicon-oxidized silicon interface at surface The deposition of thin films directly on silicon substrate 10 typically requires removal of oxidized silicon layer 12, preferably immediately prior to the formation of the film. Several prior art methods are commonly used for removing oxidized silicon layer 12 as part of the deposition process. One method is chemical etching, e.g. with an acid. A second method is sputter cleaning, either by supplying a low-energy beam of an inert gas to the substrate surface, or by back-sputtering material from the surface of the wafer directly. A third method is thermal desorption of the layer in a vacuum chamber.

Figure 2:
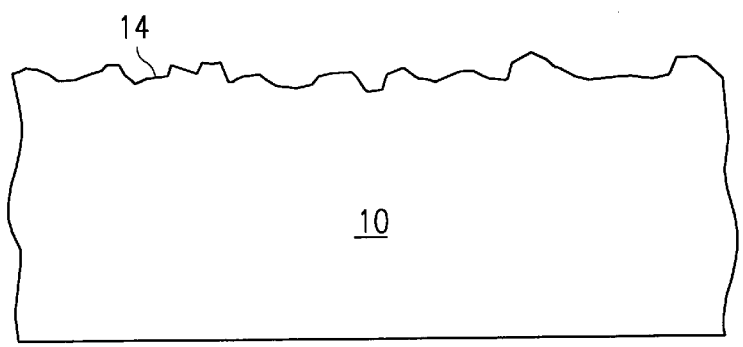
FIG. 2 illustrates a cross-section of a substrate of the type shown in FIG. 1, after removal of the oxidized silicon layer by chemical etching.

Although each of these methods adequately removes the oxide from silicon surface 11, it has now been found that each leaves the silicon surface with roughness and nonuniformities which are undesirable for ultrathin film overgrowth. Chemical removal of a surface oxide from an Si(100) substrate produces a roughened surface 14 as depicted in FIG. 2, with a measured rms roughness of about 0.4 nm (or ~2 atomic layers). Sputtering produces similar results, but may also damage the crystal structure at the substrate surface.

Figure 3:
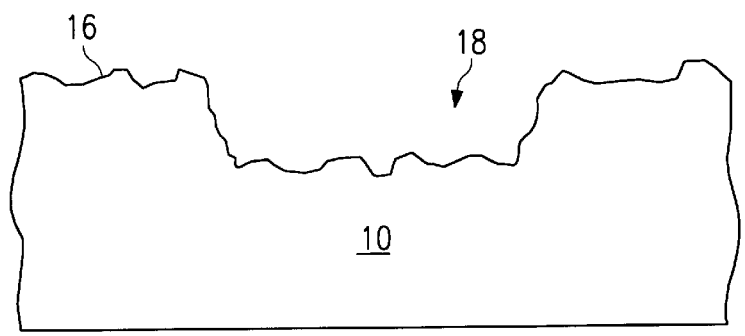
FIG. 3 illustrates a cross-section of a substrate of the type shown in FIG. 1, after removal of the oxidized silicon layer by low-temperature thermal desorption.

Thermal desorption of the surface oxide in a vacuum at temperatures below about 1200° C. not only leaves a rough surface but also forms pinholes 18 in substrate surface 16 (FIG. 3). It is now believed that thermal desorption produces pinholes due to an oxide thickness-dependent reaction of the substrate silicon with the surface oxide layer. During desorption, Si from the substrate reacts with $SiO_x$ at the interface between the substrate and the surface oxide, producing SiO which may then diffuse through the surface oxide layer and be desorbed from the surface. However, as the oxide does not thin uniformly, the reaction rate increases at various locations on the surface where the oxide has thinned more rapidly. This process is self-accelerating, and eventually forms pinholes into the substrate. Once formed, these pinholes grow rapidly as SiO may readily form and desorb from the sides of the pinhole.

In one experiment, atomic force microscopy (AFM) and scanning tunneling microscopy (STM) measurements were taken on an Si(100) substrate after desorption of a native oxide layer at 780° C. for 30 minutes in ultrahigh vacuum (~$10^{-9}$ torr). The overall surface was rough and populated with approximately 4 nm deep circular pinholes, some as large as 500 nm in diameter. The measured pinhole density was about 3 pinholes/$\mu m^2$.

The present invention overcomes the roughened surface and pinhole formation problems by supplying a silicon-containing flux to the surface of an oxidized silicon layer during thermal desorption. It is believed that this causes an SiO-producing reaction at the top surface of the oxidized silicon layer, thus removing the layer from the top down. It is also believed that the flux inhibits SiO-forming reactions at the oxide/substrate interface. Surprisingly, this results in an extremely smooth, atomically stepped surface with no pinholes.

In one example, Si(100) substrate Sample 2 (see Table 1), initially containing a native oxide, was ramped from room temperature to 780° C. in 3 minutes under ultrahigh vacuum, and held at 780° C. for 7 minutes. A physical vapor of silicon was evaporated from an e-beam evaporator containing Si source material, at an equivalent rate of 0.15 nm/sec, and directed continuously at the substrate surface once the substrate temperature was above 700° C. AFM measurements revealed that the native oxide was completely removed by this anneal, with no visible pinhole formation. The surface was smooth with single- and double-height steps, and a measured rms roughness of only 0.05 nm (or 0.3 atomic layers) over a 10 $\mu$m×10 $\mu$m area.

TABLE 1

| # | Silicon Flux | Temp. | Anneal Time | RMS Roughness | Comments |
|---|---|---|---|---|---|
| 1 | none | 780° C. | 30 min. | large | 4 nm deep pinholes |
| 2 | 0.15 nm/sec | 780° C. | 10 min. | 0.05 nm | stepped surface |
| 3 | 0.03 nm/sec | 780° C. | 30 min. | 0.14 nm | stepped surface |
| 4 | 0.10 nm/sec | 680° C. | 30 min. | 0.2 nm | stepped, rough step edges |
| 5 | 0.10 nm/sec | 640° C. | 10 min. | 0.2 nm | stepped, rougher step edges |
| 6 | 0.01 nm/sec | 780° C. | 10 min. | large | 2 nm deep smooth pits |
| 7 | 0.25 nm/sec | 780° C. | 30 min. | 0.16 nm | not stepped |
| 8 | none/ 0.03 nm/sec | 780° C. | 20 min./ 10 min. | large | reduced pinhole size and density |

A similar experiment was performed on Sample 3, except the silicon flux equivalent rate was reduced to 0.03 nm/sec, and the anneal time was increased to 30 minutes. STM imagery revealed a stepped surface with a measured rms roughness of 0.14 nm, and no visible signs of pinhole formation.

Optimal deposition results for the present invention are believed to require that the substrate temperature be sufficient to allow some rearrangement of Si adatoms at the sample surface during oxide removal. Sample 4 was annealed at the lower temperature of 680° C. The resulting surface was stepped and pinhole-free, but contained rough step edges where Si adatoms were apparently unable to migrate and form the lowest energy structure. Sample 5 was annealed at 640° C., and showed still rougher step edges. The measured rms roughness for Samples 5 and 6 was about 0.2 nm. It is believed that the rms roughness may be decreased by lowering the deposition rate and lengthening the anneal time to compensate for the reduced temperature, but that the steps become less well-defined after longer time anneals.

The present invention also requires that the silicon flux be matched closely with substrate temperature to obtain optimum results. Sample 6 was annealed at 780° C. with a low equivalent rate of 0.01 nm/sec. This low rate process was unable to adequately inhibit the SiO reaction at the oxide interface. Consequently, the resulting surface was populated with 2 nm deep pits similar to those obtained on Sample 1, although the surface and pits of Sample 6 were smoother than those of Sample 1. And for Sample 7, the equivalent rate was increased to 0.25 nm/sec, which resulted in Si removing the oxide but leaving a rougher surface (~0.16 nm rms) without a well-defined step structure. For still higher deposition rates. it is believed that Si will most likely collect on top of the oxide layer too quickly, causing an overblanketing deposition of amorphous Si on the oxide layer.

Figure 4:
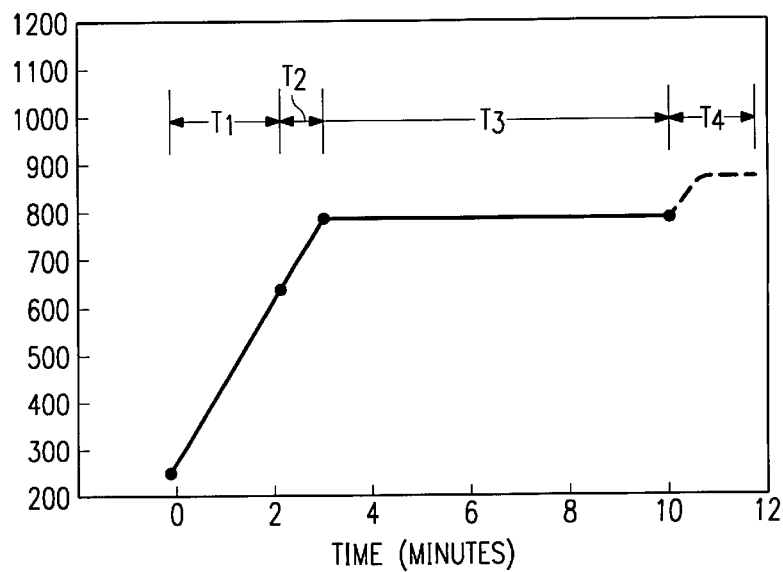
FIG. 4 contains a time-temperature curve for film formation according to one embodiment of the present invention.

It has also now been found that the best results are obtained by supplying the flux continuously during that portion of the anneal carried out above about 640° C. to 780° C. FIG. 4 depicts a time-temperature plot for one preferred embodiment. During time period $T_1$, the temperature of the wafer is low enough that no significant reaction occurs at the Si/oxide interface. Some time during time period $T_2$, the flux is initiated, and the flux is supplied continuously during time period $T_3$. At the end of $T_3$, after removal of the oxidized layer, the flux is turned off. During time period $T_4$, the desired film is deposited or grown on the wafer surface.

Significant thermal desorption prior to flux initiation has been found to produce deleterious results. Sample 8 was annealed at 780° C. for 30 minutes, with a silicon flux supplied during only the last 10 minutes of the anneal. The resulting surface still exhibited pinholes, but their diameters (~100 nm) and density (1.5 pinholes/$\mu m^2$) were decreased significantly over Sample 1. The surface between the pinholes showed a curved stepped structure, while the holes exhibited the 4-fold symmetry of the Si(100) substrate. The pinholes appear to act as step pinning centers, however, and are difficult to remove without a high temperature anneal. Deposition of epitaxial Si after removal of the oxide, in thicknesses up to 500 nm, was unable to completely fill the pinholes. Thus it is preferred that the Si flux be started at a point in the anneal prior to the point where any significant SiO reaction between the substrate and the oxide begins.

Figure 5A:
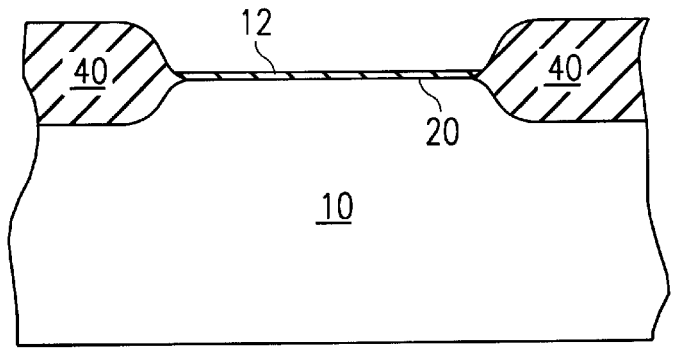
FIGS. 5A–5C illustrate cross-sections of a substrate at several stages in one embodiment of the present invention, for forming a thin gate oxide on a patterned substrate.
Figure 5B:
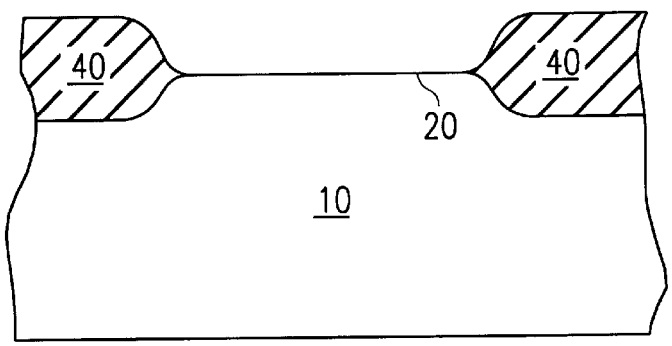
Figure 5C:
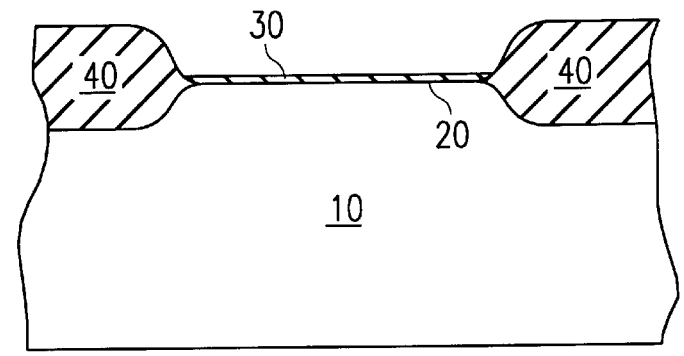

One application of the invention is in a novel process for forming an ultrathin gate oxide on a silicon substrate. FIG. 5A shows a cross-section of a partially fabricated microelectronic device on a single-crystal Si(100) substrate 10. A relatively thick patterned field oxide 40 is formed on some sections of substrate 10; a thinner oxidized silicon layer 12 is formed on at least one substrate surface region 20. A vacuum chamber housing substrate 10 is evacuated to less than about $10^{-6}$ torr, and preferably to less than about $10^{-8}$ torr. Substrate 10 is then heated to a first temperature range, preferably between about 680° C. and about 780° C., at which point a silicon flux, directed at the substrate, is initiated. This flux is then continued while the substrate is maintained at a temperature between 640° C. and 1050° C. until oxidized silicon layer 12 is removed from surface 20, as shown in FIG. 5B. At this point, surface 20 should be atomically smooth and exhibit a stepped structure. Preferably, the silicon flux is then terminated, and an oxygen source is supplied to the heated wafer to grow ultrathin gate oxide 30 on surface 20. Gate oxide 30 shown in FIG. 5C may be formed by this process to be exceptionally smooth and uniform, even at thicknesses less than 5 nm.

Figure 6:
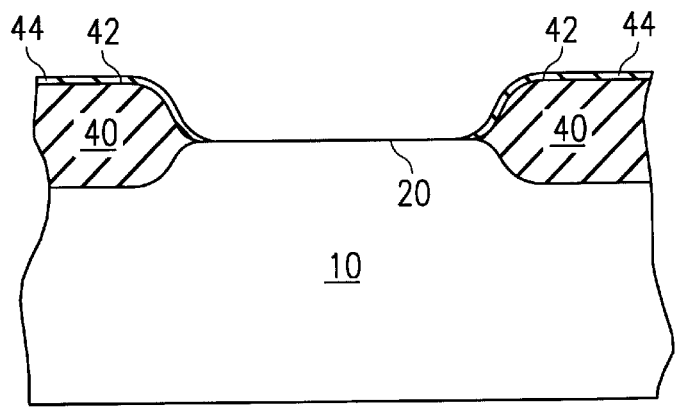
FIG. 6 illustrates a cross-section of a substrate at one stage in a second embodiment of the present invention.

In the previous embodiment, it is assumed that the flux and temperature combination also resulted in the removal of some material from gate oxide 40. However, at lower temperatures and/or higher flux, the silicon flux may be supplied to the substrate at a rate which is appropriate for removal of oxidized silicon layer 12 and yet exceeds the desorption rate of the field oxide 40. Thus, in one alternate embodiment, the step of supplying the silicon flux to the substrate may result in the formation of a polysilicon or amorphous silicon cap layer 44 on surface 42, as shown in FIG. 6. However during gate oxide growth, cap layer 44, or at least an upper portion thereof, will also be oxidized, thus resulting in a structure similar to FIG. 5C despite the film overgrowth.

Figure 7:
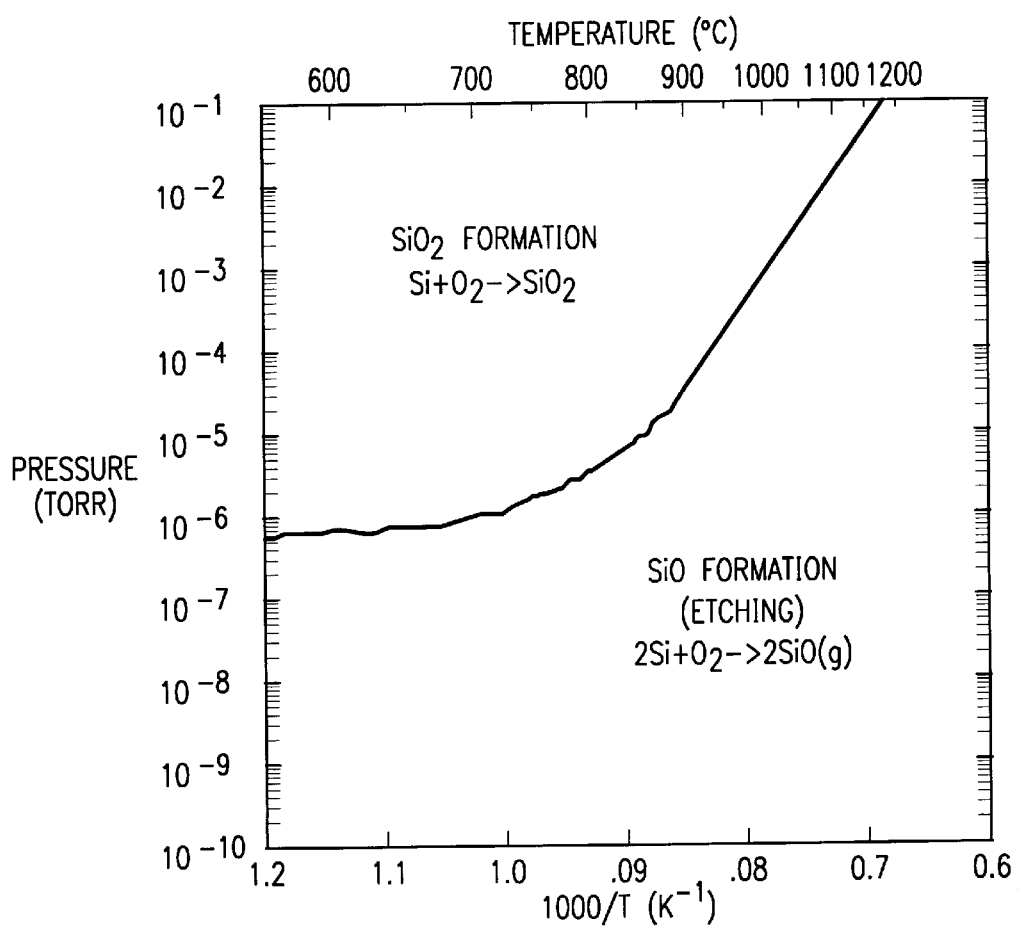
FIG. 7 is a phase diagram illustrating a range of pressure-temperature conditions useful for practicing the present invention.

Some preferred temperature and pressure conditions are illustrated in the phase diagram of FIG. 7. The area labeled SiO Formation comprises reaction conditions which favor removal of oxidized silicon with a silicon flux.

The silicon flux may be supplied by a variety of methods. One preferred silicon flux source is silicon sputtered or evaporated from an appropriate target. Another preferred silicon flux source is a chemical vapor of an appropriate silicon-containing source gas. Some preferred source gases include silane, disilane, chlorosilane, dichlorosilane, trichlorosilane, tetrachlorosilane, and combinations thereof. Chlorine-containing sources may give the additional advantage of enhanced removal of impurities in the oxide layer and at the interface, such as carbon and metals.

A few preferred embodiments have been described herein. Various alternative embodiments and modifications will become apparent to those skilled in the art upon reading this description. For example, instead of immediately depositing a desired film after removal of the oxidized silicon layer, the surface may be temporarily passivated, e.g. with hydrogen, and transported to a separate deposition station. Such embodiments allow deposition of thin films by spin-on techniques while obtaining the advantages of the present invention.

What is claimed is:

1. A method of forming a non-epitaxial thin film on a single-crystal silicon substrate, said method comprising the steps of:

forming a first oxidized silicon layer on a first region of said substrate by allowing a native oxide layer to form;

forming a second oxidized silicon layer on at least one second region of said substrate;

placing said substrate in a vacuum;

providing a silicon-containing flux to said substrate, said flux being insufficient to deposit a silicon-containing layer on said first oxidized silicon layer but sufficient to substantially inhibit an SiO-forming reaction between said silicon substrate and said first oxidized silicon layer;

continuing said flux until said first oxidized silicon layer is removed from said first region of said substrate, wherein said second oxidized silicon layer is not completely removed during said removal of said first oxidized silicon layer; and forming said non-epitaxial thin film on said first region of said substrate.

2. The method of claim 1, wherein said single-crystal substrate is oriented substantially in the (100) plane.

3. The method of claim 1, wherein said second layer is a field oxide layer.

4. The method of claim 1, wherein said vacuum is maintained in a range of about $10^{-10}$ torr to about $10^{-8}$ torr during said providing a silicon-containing flux step.

5. The method of claim 1, wherein said silicon-containing flux is provided to said substrate by a physical vapor deposition method.

6. The method of claim 5, wherein said physical vapor deposition method is selected from the group consisting of sputtering and evaporation.

7. The method of claim 1, wherein said silicon-containing flux is provided to said substrate by a chemical vapor deposition method.

8. The method of claim 7, wherein said silicon-containing flux is selected from the group consisting of silane, disilane, chlorosilane, dichlorosilane, trichlorosilane, tetrachlorosilane, and combinations thereof.

9. The method of claim 1, wherein said depositing said non-epitaxial film step is performed without first returning said substrate to atmospheric pressure.

10. A method of forming a non-epitaxial thin film on a single-crystal silicon substrate, said method comprising the steps of:

forming an oxidized silicon layer on a first region of said substrate;

placing said substrate in a vacuum and heating said substrate to a first temperature range of about 640° C. to about 780° C.;

providing a silicon-containing flux to said substrate, said flux being insufficient to deposit a silicon-containing layer on said oxidized silicon layer but sufficient to substantially inhibit an SiO-forming reaction between said silicon substrate and said oxidized silicon layer;

while continuing said flux, maintaining said substrate in a second temperature range of about 640° C. to about 1050° C. until said first oxidized silicon layer is removed from said first region of said substrate; and forming said non-epitaxial thin film on said first region of said substrate.

11. The method of claim 10, wherein said non-epitaxial thin film is a dielectric thin film.

12. The method of claim 11, wherein said dielectric thin film is selected from the group consisting of silicon dioxide, silicon nitride, tantalum pentoxide, titanium dioxide, barium titanate, strontium titanate, bismuth titanate, and combinations thereof.

13. The method of claim 10, wherein said non-epitaxial thin film is a conductive thin film.

14. A method of forming a gate dielectric thin film on a single-crystal silicon substrate oriented substantially in the (100) plane and having a first oxidized silicon layer formed on a first region of a first surface thereof and a field oxide layer formed on a second region of said first surface, said method comprising the steps of:

placing said substrate in a vacuum chamber and evacuating said chamber to less than about $10^{-6}$ torr;

heating said substrate to a first temperature range of about 680° C. to about 780° C.;

providing a silicon-containing flux to said first surface at an equivalent rate greater than 0.01 nm/s;

while continuing said flux, maintaining said substrate in a second temperature range of about 680° C. to about 1050° C. until said first oxidized silicon layer is removed from said first surface; and depositing said gate dielectric thin film on said substrate.

15. The method of claim 14, wherein said gate dielectric film is a silicon dioxide thin film.

16. The method of claim 15, wherein said providing a silicon-containing flux step deposits a layer of silicon on said field oxide layer, and wherein said depositing a gate dielectric thin film step at least partially oxidizes said layer of silicon.

* * * * *

UNITED STATES PATENT AND TRADEMARK OFFICE
CERTIFICATE OF CORRECTION

PATENT NO.    : 6,020,247
DATED         : February 1, 2000
INVENTOR(S)   : Glen D. Wilk, Yi Wei and Robert M. Wallace It is certified that error appears in the above-identified patent and that said Letters Patent is hereby corrected as shown below:

<u>Title page,</u>
Item [60], insert under Related U.S. Application Data

-- Provisional Application No. 60/023,230   Aug. 5, 1996. --

Signed and Sealed this

Twenty-fifth Day of June, 2002

Attest:

Attesting Officer

JAMES E. ROGAN
*Director of the United States Patent and Trademark Office*